United States Patent
Kim et al.

(10) Patent No.: US 8,169,053 B2
(45) Date of Patent: May 1, 2012

(54) RESISTIVE RANDOM ACCESS MEMORIES AND METHODS OF MANUFACTURING THE SAME

(75) Inventors: Ki-hwan Kim, Daejeon (KR);
Young-soo Park, Seoul (KR);
Myung-jae Lee, Suwon-si (KR);
Xianyu Wenxu, Suwon-si (KR);
Seung-eon Ahn, Seoul (KR);
Chang-bum Lee, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 166 days.

(21) Appl. No.: 12/289,069

(22) Filed: Oct. 20, 2008

(65) Prior Publication Data
US 2009/0184396 A1 Jul. 23, 2009

(30) Foreign Application Priority Data
Jan. 22, 2008 (KR) .................. 10-2008-0006702

(51) Int. Cl.
*H01L 29/00* (2006.01)
(52) U.S. Cl. ... 257/537; 257/42; 257/314; 257/E27.004; 365/148; 438/237; 438/303
(58) Field of Classification Search .................. 257/314, 257/E27.004, 42, 537; 438/237, 303; 365/148
See application file for complete search history.

(56) References Cited

U.S. PATENT DOCUMENTS

| | | | |
|---|---|---|---|
| 5,396,095 A * | 3/1995 | Wolters et al. | 257/310 |
| 5,508,540 A * | 4/1996 | Ikeda et al. | 257/298 |
| 6,185,122 B1 | 2/2001 | Johnson et al. | |
| 6,709,991 B1 | 3/2004 | Kawahara et al. | |
| 6,830,786 B2 | 12/2004 | Yuda et al. | |
| 6,849,564 B2 | 2/2005 | Hsu et al. | |
| 6,885,573 B2 | 4/2005 | Sharma et al. | |
| 0,145,894 A1 | 7/2005 | Chau et al. | |
| 0,038,293 A1 | 2/2006 | Rueger et al. | |
| 7,077,904 B2 | 7/2006 | Cho et al. | |
| 7,081,380 B2 | 7/2006 | Lee et al. | |
| 7,265,403 B2 * | 9/2007 | Ito | 257/295 |
| 7,297,559 B2 * | 11/2007 | Honma et al. | 438/3 |
| 7,425,512 B2 * | 9/2008 | Udayakumar et al. | 438/740 |
| 7,807,995 B2 * | 10/2010 | Mikawa et al. | 257/43 |

(Continued)

FOREIGN PATENT DOCUMENTS
KR 2002-0001328 1/2002
(Continued)

OTHER PUBLICATIONS
U.S. Office Action dated Nov. 10, 2010.
(Continued)

*Primary Examiner* — Wael Fahmy
*Assistant Examiner* — John C Ingham
(74) *Attorney, Agent, or Firm* — Harness, Dickey & Pierce, P.L.C.

(57) ABSTRACT

Provided are resistive random access memories (RRAMs) and methods of manufacturing the same. A RRAM includes a storage node including a variable resistance layer, a switching device connected to the storage node, and a protective layer covering an exposed part of the variable resistance layer. The protective layer includes at least one of aluminum oxide and titanium oxide. The variable resistance layer is a metal oxide layer.

14 Claims, 10 Drawing Sheets

U.S. PATENT DOCUMENTS

| | | |
|---|---|---|
| 2003/0089954 A1 | 5/2003 | Sashida |
| 2006/0097288 A1* | 5/2006 | Baek et al. ............ 257/208 |
| 2006/0268594 A1* | 11/2006 | Toda .................... 365/100 |
| 2007/0205456 A1 | 9/2007 | Lee et al. |
| 2010/0065807 A1* | 3/2010 | Takagi et al. ............ 257/5 |

FOREIGN PATENT DOCUMENTS

| | | |
|---|---|---|
| KR | 2002-0036580 | 5/2002 |
| KR | 10-0366621 | 1/2003 |
| KR | 10-2005-0094690 | 9/2005 |
| KR | 10-2006-0003211 | 1/2006 |
| KR | 10-0564609 | 3/2006 |
| KR | 10-2006-0042734 | 5/2006 |
| KR | 2006-0042730 | 5/2006 |
| KR | 2006-0076500 | 7/2006 |
| KR | 10-2007-0014410 | 2/2007 |
| KR | 10-2007-0062435 | 6/2007 |
| WO | WO 2007/010746 | 1/2007 |

OTHER PUBLICATIONS

Extended European Search Report for European Appln. No. 09163580.5 dated Aug. 3, 2011.

* cited by examiner

RESISTIVE RANDOM ACCESS MEMORIES AND METHODS OF MANUFACTURING THE SAME

PRIORITY STATEMENT

This non-provisional U.S. patent application claims priority under 35 U.S.C. §119 to Korean Patent Application No. 10-2008-0006702, filed on Jan. 22, 2008, in the Korean Intellectual Property Office, the entire contents of which is incorporated herein by reference.

BACKGROUND

Description of the Related Art

Resistive random access memories (RRAMs) are non-volatile memory devices using changes in resistance characteristics of a material to store data. Example materials (e.g., a transition metal oxide) used in RRAMs have a resistance that changes relatively significantly at a particular voltage. When a set voltage is applied to a variable resistance material, the resistance of the variable resistance material decreases, which is referred to as an ON state. When a reset voltage is applied to the variable resistance material, the resistance of the variable resistance material increases; which is referred to as an OFF state. Among conventional RRAMs, a multi-layer crosspoint RRAM has a relatively simple cell structure and relatively high density.

A storage node of a RRAM includes a variable resistance layer composed of the variable resistance material. A conventional RRAM uses a metal oxide layer such as a nickel oxide $NiO_x$ as the variable resistance layer. However, when a silicon oxide interlayer insulating layer is formed on both a metal oxide variable resistance layer and a diode electrically connected to the variable resistance layer, silicide may form in an interface between the variable resistance layer and the silicon oxide layer and in an interface between the diode and the silicon oxide layer. Because the silicide has characteristics similar to those of a metal, memory functions of the RRAM may deteriorate. Also, the characteristics of the variable resistance layer may deteriorate due to permeation of hydrogen from the outside.

SUMMARY

Example embodiments relate to semiconductor devices and methods of manufacturing the same, for example, resistive random access memories (RRAMs) and methods of manufacturing the same.

Example embodiments provide resistive random access memories (RRAMs) using variable resistance characteristics of a variable resistance material, and methods of manufacturing RRAMs.

According to at least one example embodiment, a RRAM may include a storage node including a variable resistance layer, a switching device connected to the storage layer, and a protective layer covering an exposed part of the variable resistance layer.

According to at least some example embodiments, the protective layer may be formed of a material that does not cause a silicide reaction with the variable resistance layer. The protective layer may be formed of a material that suppresses and/or prevents formation of a silicide between the variable resistance layer and the switching device. The protective layer may also be a material layer for suppressing and/or preventing the permeation of hydrogen from the outside. The protective layer may include, for example, at least one of aluminum oxide and titanium oxide. The variable resistance layer may be a metal oxide or similar layer. The switching device may be a diode. An intermediate electrode may be formed between the variable resistance layer and the switching device.

According to at least one other example embodiment, an RRAM may include a first electrode, a variable resistance layer, an intermediate electrode, a diode, and a second electrode stacked sequentially. A protective layer may be formed between the variable resistance layer and the diode. The positions of the diode and the variable resistance layer may be interchangeable (e.g., exchanged with each other). The protective layer may cover at least a portion of the diode. For example, the protective layer may cover side surfaces of the variable resistance layer, the intermediate electrode, and/or the diode. The first electrode and the second electrode may have wiring shapes and cross each other.

According to at least some example embodiments, the RRAM may be a multi-layer crosspoint memory device having a 1 diode-1 resistance (1D-1R) cell structure.

At least one other example embodiment provides a method of manufacturing a RRAM. The RRAM may include a storage node and a switching device connected to the storage node. The storage node may include a variable resistance layer. A protective layer may be formed to cover an exposed part of the variable resistance layer.

At least one other example embodiment provides a method of manufacturing a RRAM. According to at least this example embodiment, a first electrode may be formed on a substrate. A stacked structure may be formed on the first electrode. The stacked structure may include a variable resistance layer, a switching device, and an intermediate electrode formed between the variable resistance layer and the switching device. A protective layer may be formed on the substrate to cover the first electrode and the stacked structure. An interlayer insulating layer may be formed on the protective layer. The interlayer insulating layer may be etched until the protective layer on an upper surface of the stacked structure is exposed. The stacked structure may be exposed by etching the exposed protective layer. A second electrode may be formed to contact the stacked structure. The switching device may be a diode.

According to at least some example embodiments, the protective layer may be formed of a material that does not cause a silicide reaction with the variable resistance layer. According to at least some example embodiments, the protective layer may be formed of a material that suppresses and/or prevents formation of a silicide between the variable resistance layer and the switching device. The protective layer may also be a material layer for suppressing and/or preventing the permeation of hydrogen from the outside. The protective layer may include at least one of aluminum oxide and titanium oxide. The variable resistance layer may be formed of metal oxide or the like.

According to at least some example embodiments, the forming of the storage node further may include forming a first electrode on a substrate, forming the variable resistance layer on the first electrode, and forming an intermediate electrode on the variable resistance layer. A switching device may be formed on the intermediate electrode, and the variable resistance layer, the switching device and the intermediate electrode may constitute a stacked structure. The protective layer may be formed to cover the first electrode and the stacked structure. An interlayer insulating layer may be formed on the protective layer. The interlayer insulating layer may be etched to expose the protective layer on an upper surface of the stacked structure. The stacked structure may be exposed by etching the exposed protective layer, and a second electrode contacting the stacked structure may be formed.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

Further, it will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

Further still, it will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Hereinafter, resistive random access memories (RRAMs) and methods of manufacturing RRAMs according to example embodiments will be described in detail with reference to the attached drawings. In the drawings, the thicknesses of layers and regions are exaggerated for clarity. Like reference numerals in the drawings denote like elements.

Figure 1:
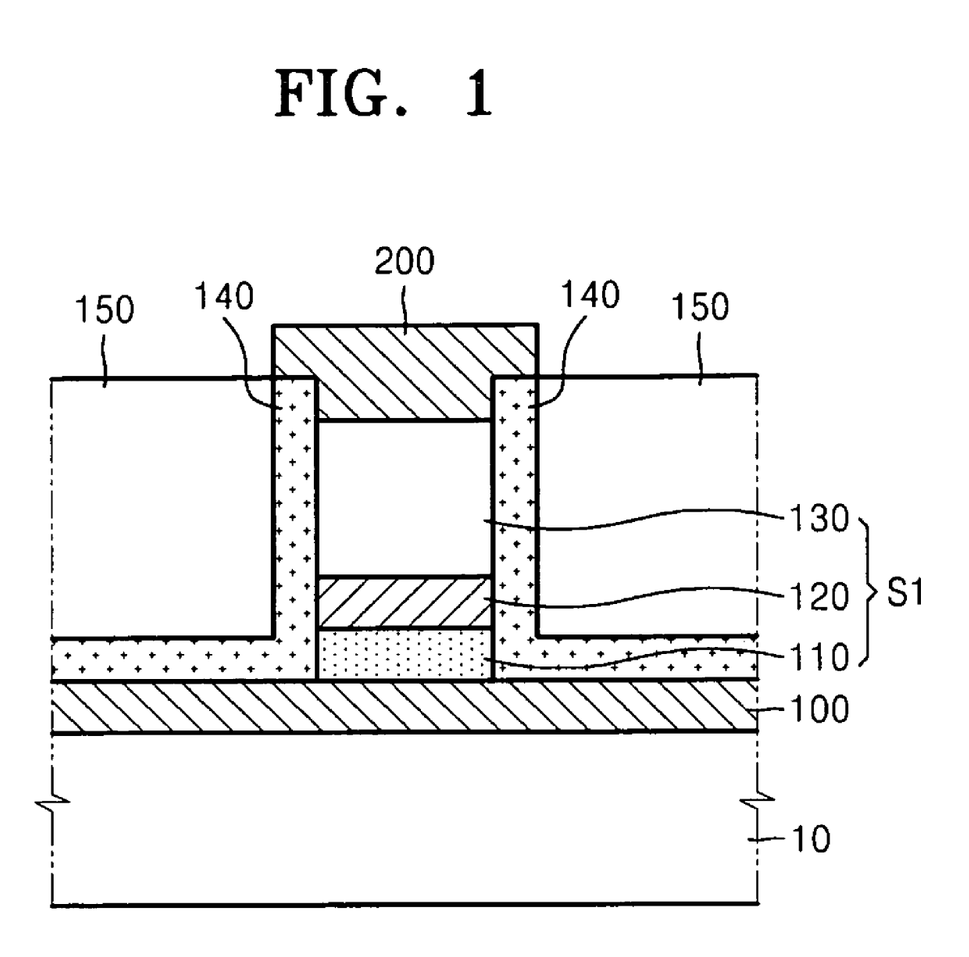
FIG. 1 is a cross-sectional view of a resistive random access memory (RRAM) according to an example embodiment.

FIG. 1 is a cross-sectional view of a RRAM according to an example embodiment.

Referring to FIG. 1, a first electrode 100 may be formed on a substrate 10. A first stacked structure S1 may be formed on the first electrode 100. The first stacked structure S1 may include a variable resistance layer 110, an intermediate electrode 120, and a switching device 130 stacked sequentially on the first electrode 100. The switching device 130 may be a diode and will be described as such herein for example purposes. The first electrode 100, the variable resistance layer 110, and the intermediate electrode 120 may constitute a storage node. The intermediate electrode 120 may electrically connect the variable resistance layer 110 and the diode 130. If the intermediate electrode 120 is omitted, the diode 130 may operate as a resistor, thereby causing operating problems for the RRAM.

A protective layer 140 may cover side surfaces of the first stacked structure S1. The protective layer 140 may also cover a top surface of a portion of the first electrode 100 on which the first stacked structure S1 is not formed. The vertical height of the protective layer 140 may be greater than or equal to the height of the first stacked structure S1. So long as the protective layer 140 covers an exposed portion of the variable resistance layer 110, a forming range and shape of the protective layer 140 may vary. The protective layer 140 may be a layer that does not react with the variable resistance layer 110 to form silicide. In addition, the protective layer 140 may be formed of a material for suppressing and/or preventing permeation of hydrogen from the outside. For example, the protective layer 140 may be formed of at least one of aluminum oxide, titanium oxide or the like.

The protective layer 140 may suppress and/or prevent formation of silicide between the variable resistance layer 110 and the protective layer 140. As a result, deterioration of the characteristics of the RRAM due to the silicide may be suppressed and/or prevented. The protective layer 140 may also (or alternatively) suppress and/or minimize permeation of impurities, such as hydrogen, into the variable resistance layer 110. Therefore, according to example embodiments, a RRAM having improved (e.g., excellent) reliability and/or memory function may be realized.

An interlayer insulating layer 150 covering the protective layer 140 may be formed around the first stacked structure S1. The interlayer insulating layer 150 may be a silicon oxide or similar layer. The interlayer insulating layer 150 may have a height similar or substantially similar to that of the protective layer 140. In one example, the interlayer insulating layer 150 may have the same or substantially the same height as that of the protective layer 140. A second electrode 200 contacting the diode 130 may be formed on the protective layer 140. The first and second electrodes 100 and 200 may be formed in line patterns crossing each other at a point. The second electrode 200 may cover a portion of the interlayer insulating layer 150. The structure of FIG. 1 may be a part of a multi-layer crosspoint RRAM having a 1 diode-1 resistance (1D-1R) cell structure.

The protective layer 140 may suppress and/or prevent deterioration of the variable resistance layer 110, and the switching device or diode 130. For example, if the diode 130 has a structure in which a p-type semiconductor layer (e.g., a CuO layer) and an n-type semiconductor layer (e.g., an InZnO layer) are stacked sequentially, but without a protective layer 140, the characteristics of the diode 130 may deteriorate during annealing. In this example, dopants of the diode 130 may be out-diffused by the annealing operation, and thus, switching characteristics of the diode 130 may deteriorate. However, as described in example embodiments, the protective layer 140 covering the side surfaces of the diode 130 may suppress, prevent and/or minimize the out-diffusion of the dopants. Even if materials for forming the diode 130 are different, the protective layer 140 may have the same or substantially the same effects as described above.

The particular structure of example embodiments may be different than that shown in FIG. 1. For example, in the first stacked structure S1, the positions of the variable resistance layer 110 and the diode 130 may be exchanged with each other and/or the positions of the p-type semiconductor layer and n-type semiconductor layer of the diode 130 may be exchanged with each other.

In at least one example embodiment, the interlayer insulating layer 150 may be omitted. In this example, the second electrode 200 may have a curved wiring shape. Alternatively, a contact electrode layer may be formed between the diode 130 and the second electrode 200.

Figure 2:
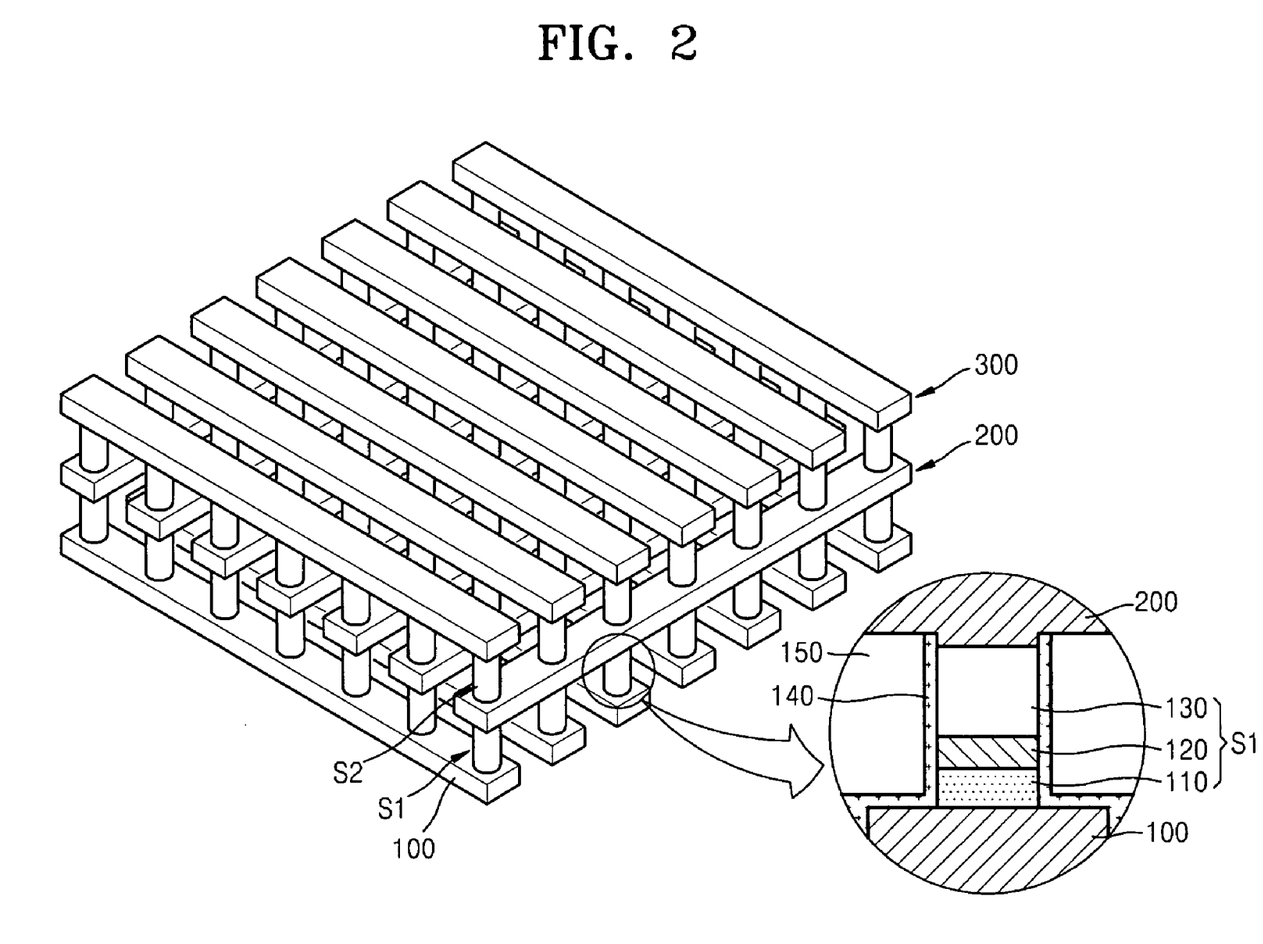
FIG. 2 is a perspective view of a multi-layer crosspoint RRAM including the structure of FIG. 1 according to an example embodiment.

FIG. 2 is a perspective view of a multi-layer crosspoint RRAM including the structure of FIG. 1 according to an example embodiment. For the sake of clarity, the protective layer 140 and the interlayer insulating layer 150 are omitted from the perspective view of FIG. 2, but shown in an enlarged cross-sectional view of FIG. 2.

Referring to FIG. 2, a plurality of first electrodes 100 may be formed on a substrate (not shown). The first electrodes 100 may be spaced apart from one another at the same or substantially the same intervals. Each of the first electrodes 100 may have a wiring shape. A plurality of second electrodes 200 may also have wiring shapes and be spaced apart from one another at the same or substantially the same intervals. For example, the plurality of second electrodes 200 may be spaced apart from the top surfaces of the first electrodes 100 at given, desired or predetermined intervals. The first electrodes 100 and the second electrodes 200 may cross each other at right angles.

The first stacked structure S1 may be formed at (or in) a crosspoint between the first electrode 100 and the second electrode 200. As illustrated in the enlarged cross-sectional view of FIG. 2, the first stacked structure S1 may include the variable resistance layer 110, the intermediate electrode 120, and the diode 130 stacked sequentially on the first electrode 100. The positions of the variable resistance layer 110 and the diode 130 may be exchanged with each other. The variable resistance layer 110, the intermediate electrode 120, and the diode 130 may have dot patterns with a similar or substantially similar sizes and/or shapes. Alternatively, however, one or more of the variable resistance layer 110, the intermediate electrode 120, and the diode 130 may have different sizes and/or shapes.

The diode 130 (e.g., a vertical diode) may have a structure in which a p-type oxide layer and an n-type oxide layer are stacked sequentially. Alternatively, the diode 130 may have a structure in which a p-type silicon layer and an n-type silicon layer are stacked sequentially. For example, the diode 130 may have a structure in which a p-type oxide layer (e.g., a CuO layer) and an n-type oxide layer (e.g., an InZnO layer) are stacked sequentially.

The interlayer insulating layer 150 may be formed on the protective layer 140. The interlayer insulating layer 150 may cover side surfaces of the first stacked structure S1 so as to fill a gap between the first electrode 100 and the second electrode 200.

The first electrode 100, the first stacked structure S1, and the second electrode 200 of FIG. 2 correspond to the first electrode 100, the first stacked structure S1, and the second electrode 200 of FIG. 1, respectively.

A plurality of third electrodes 300 may be formed spaced apart from the top surfaces of the second electrodes 200 at a given, desired or predetermined interval. The third electrodes 300 may have wiring shapes and may be spaced apart from each other at the same or substantially the same intervals. The third electrodes 300 may cross the second electrodes 200 at right angles. A second stacked structure S2 may be formed at (or in) a crosspoint between the second electrode 200 and the third electrode 300.

Figure 3A:
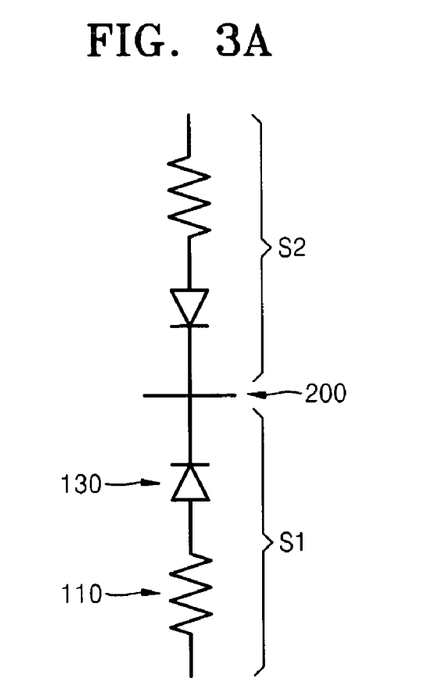
FIGS. 3A and 3B are circuit diagrams of RRAMs according to example embodiments.
Figure 3B:
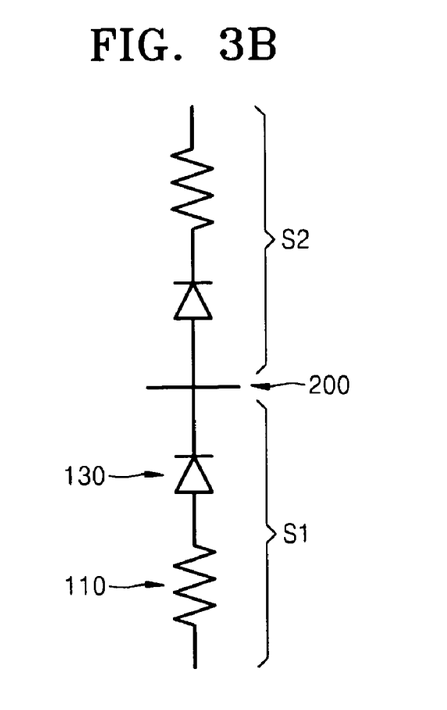

The second stacked structure S2 and the first stacked structure S1 may or may not have structures with reflection symmetry from a circuit point of view. For example, when the first stacked structure S1 includes a structure in which the intermediate electrode 120 and the diode 130 are sequentially stacked on the variable resistance layer 110, the second stacked structure S2 may include a structure in which an intermediate electrode and a variable resistance layer are sequentially stacked on a diode. In this example, the diode 130 of the first stacked structure S1 and the diode of the second stacked structure S2 may have the same or substantially the same structure, not a structure with reflection symmetry from a circuit point of view. FIGS. 3A and 3B illustrate example circuit configurations of the first stacked structure S1, the second electrode 200, and the second stacked structure S2.

In FIGS. 3A and 3B, a rectifying direction of the diode 130 may be changed. In addition, in the first stacked structure S1, the positions of the variable resistance layer 110 and the diode 130 may be exchanged with each other. The rectifying direction of the diode and the positions of the variable resistance layer and diode in the second stacked structure S2 may also be changed in a similar manner.

Although not shown in FIG. 2, a protective layer may be formed on side surfaces of the second stacked structure S2. Also, a stacked structure having the same or substantially the same configuration as the first stacked structure S1 or the second stacked structure S2 and another electrode may be alternately stacked on the third electrode 300.

The first and second stacked structures S1 and S2 may have cylindrical shapes; however, example embodiments are not limited thereto. For example, the first and second stacked structures S1 and S2 may have square pole shapes, or other shapes, for example, a cone- or pyramid-shaped structure in which a width thereof increases downward. Alternatively, the first stacked structure S1 and/or the second stacked structure S2 may have asymmetrical shapes in which the first stacked structure S1 and/or second stacked structure S2 extend to the outside of a crosspoint between the first and second electrodes 100 and 200 and/or a crosspoint between the second and third electrodes 200 and 300, respectively.

Figure 4:
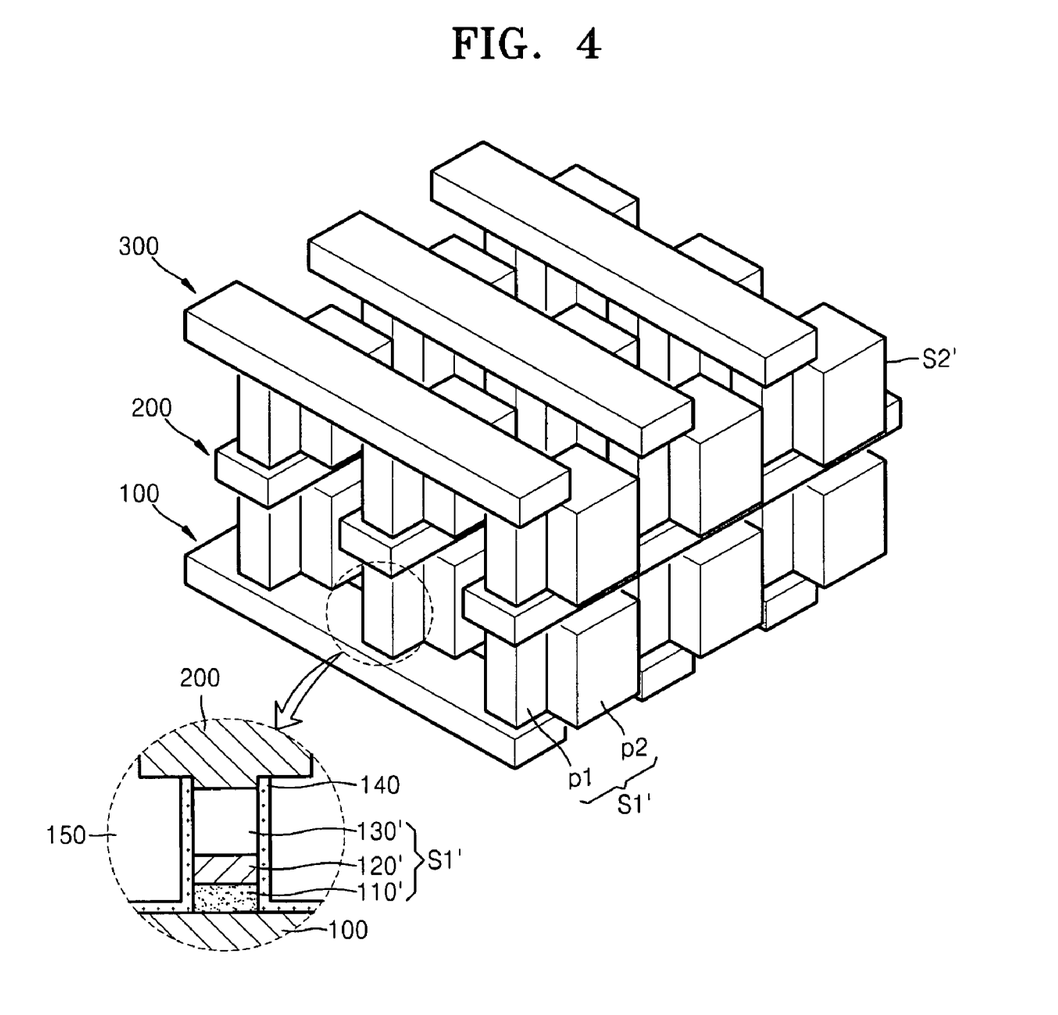
FIG. 4 is a perspective view of a RRAM according to another example embodiment.

FIG. 4 is a perspective view of a RRAM according to another example embodiment. In the example embodiment shown in FIG. 4, the first stacked structure S1' and the second stacked structure S2' have asymmetrical shapes in which the first stacked structure S1' and second stacked structure S2' extend to the outside of a crosspoint between the first and second electrodes 100 and 200 and a crosspoint between the second and third electrodes 200 and 300, respectively.

Referring to FIG. 4, first and second stacked structures S1' and S2' may be formed between first and second electrodes 100 and 200 and between the second and third electrodes 200 and 300, respectively. The first stacked structure S1' may include a first part or portion p1 formed at or in a crosspoint between the first and second electrodes 100 and 200 and a second part or portion p2. The second part p2 may contact the first part p1 and extend outside of the crosspoint between the first and second electrodes 100 and 200. A width of the second part p2 may be greater than a width of the first part p1. The shapes of the first part p1 and the second part p2 illustrated in FIG. 4 are examples, but a position and size of the second part p2 may vary. A planar structure of the second stacked structure S2' may be the same or substantially the same as that of the first stacked structure S1'.

In the example extended structure of the first and second stacked structures S1' and S2', a forward current of a diode may be relatively large, and thus switching characteristics of the diode may improve. The first and second stacked structures S1' and S2' may extend from the crosspoint between the first and second electrodes 100 and 200 and the crosspoint between the second and third electrodes 200 and 300, respectively, to enlarge an electrically available area of each diode of the first and second stacked structures S1' and S2'. Accordingly, the shapes and positions of the diodes or the stacked structures S1' and S2' may vary. On the other hand, in the case of a variable resistance layer, even if the first and second stacked structures S1' and S2' have relatively large sizes, valid resistance variation characteristics may occur only in the first part p1 contacting the first, second, and third electrodes 100, 200, and 300. Thus, even if the first and second stacked structures S1' and S2' have relatively large sizes, a current necessary for the resistance variation characteristics may not increase. Also, the variable resistance layer may be formed as a structure, which does not extend from the crosspoints.

Referring to the enlarged cross-sectional view of FIG. 4, each first stacked structure S1' may include a variable resistance layer 110', an intermediate electrode 120', and a switching device 130' stacked sequentially on the first electrode 100. For example purposes, the switching device 130' will be discussed as being a diode; however, example embodiments are not limited thereto.

In this example, the positions of the variable resistance layer 110' and the diode 130' may be exchanged with each other. The second stacked structure S2' may include a structure in which a diode, an intermediate electrode, and a variable resistance layer are stacked sequentially or may include an inverse structure thereof. The interlayer insulating layer 150 may be formed on the protective layer 140 covering side surfaces of the first stacked structure S1'. Although not shown in the drawing, a protective layer may also be formed on side surfaces of the second stacked structure S2'. Also, a stacked structure, which may be the same or substantially the same as the first or second stacked structures S1' or S2', and another electrode may be alternately stacked on the third electrode 300.

Figure 5:
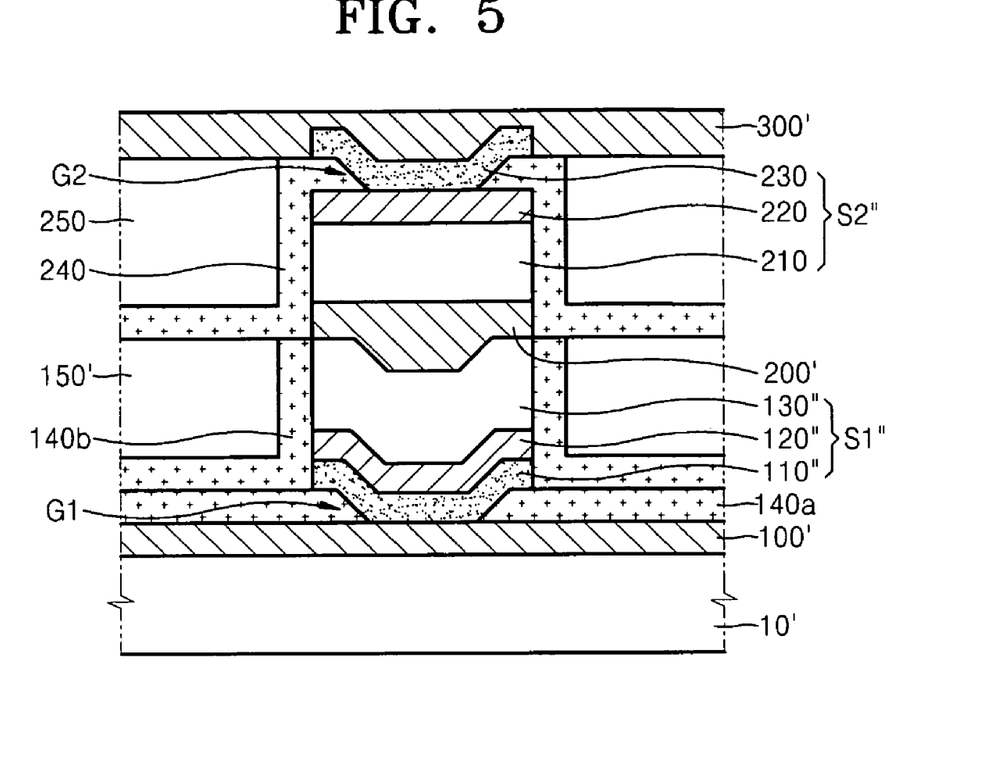
FIG. 5 is a cross-sectional view of a RRAM according to another example embodiment.

FIG. 5 is a cross-sectional view of a RRAM according to another example embodiment.

Referring to FIG. 5, a first electrode 100' may be formed on a substrate 10'. A first lower protective layer 140a having a first groove G1 exposing a portion of a top surface of the first electrode 100' may be formed on the first electrode 100'. The first groove G1 may be formed by inclination etching, and as a result, a width of the first groove G1 may decrease toward the first electrode 100' (e.g., the groove G1 may have sloped side surfaces). Alternatively, the width of the first groove G1 may be uniform according to the depth of the first groove G1. A first stacked structure S1" may be formed on the first electrode 100' exposed by the first groove G1. The first stacked structure S1" may include a first variable resistance layer 110", a first intermediate electrode 120", and a first diode 130" stacked sequentially on the first electrode 100'. Layers including the first stacked structure S1" may have shapes bent or contoured along the shape of the first groove G1. The side surfaces of the first stacked structure S1" and a top surface of the first lower protective layer 140a may be covered by a first upper protective layer 140b. According to at least this example embodiment, the first upper protective layer 140b may optionally be formed on the top surface of the first lower protective layer 140a.

A first interlayer insulating layer 150' may be formed on side surfaces of the first upper protective layer 140b formed on the side surface of the first stacked structure S1". The first interlayer insulating layer 150' may have a height similar or substantially similar to that of the first upper protective layer 140b, A second electrode 200' contacting the first diode 130" may be formed on the first stacked structure S1". The first electrode 100' and the second electrode 200' may have wiring shapes and may cross each other at right angles.

A second diode 210 and a second intermediate electrode 220 may be formed sequentially on the second electrode 200'. A second protective layer 240 may be formed on the interlayer insulating layer 150' and the first upper protective layer 140b. The second protective layer 240 may surround the second diode 210 and the second intermediate electrode 220 and may have a second groove G2 exposing a top surface of the second intermediate electrode 220. The second groove G2 may have a shape similar or substantially similar to that of the first groove G1.

A second interlayer insulating layer 250 may be formed around the second protective layer 240. The second interlayer insulating layer 250 may have a height similar or substantially similar to that of the second protective layer 240. A second variable resistance layer 230 may be formed on the second intermediate electrode 220 exposed by the second groove G2. The second variable resistance layer 230 may contact the second intermediate electrode 220. A third electrode 300' contacting the second variable resistance layer 230 may be formed on the second interlayer insulating layer 250. The third electrode 300' may have a wiring shape and may cross the second electrode 200'.

A second stacked structure S2" may include the second diode 210, the second intermediate electrode 220, and the second variable resistance layer 230 stacked sequentially on the second electrode 200'. The first and second stacked structures S1" and S2" may have pole shapes similar or substantially similar to those of the first and second stacked structures S1 and S2 of FIG. 2 or have asymmetrical structures similar or substantially similar to the first and second stacked structures S1' and S2' of FIG. 4. When the first and second stacked structures S1" and S2" have the asymmetrical structures, a contact electrode layer (not shown) covering a top surface of the first diode 130" may be formed between the first diode 130" and the second electrode 200'.

FIGS. 6A through 6E are cross-sectional views of a method of manufacturing an RRAM according to an example embodiment. The example embodiment shown in FIGS. 6A through 6E may be used to manufacture the example embodiment of an RRAM shown in FIG. 1.

Figure 6A:
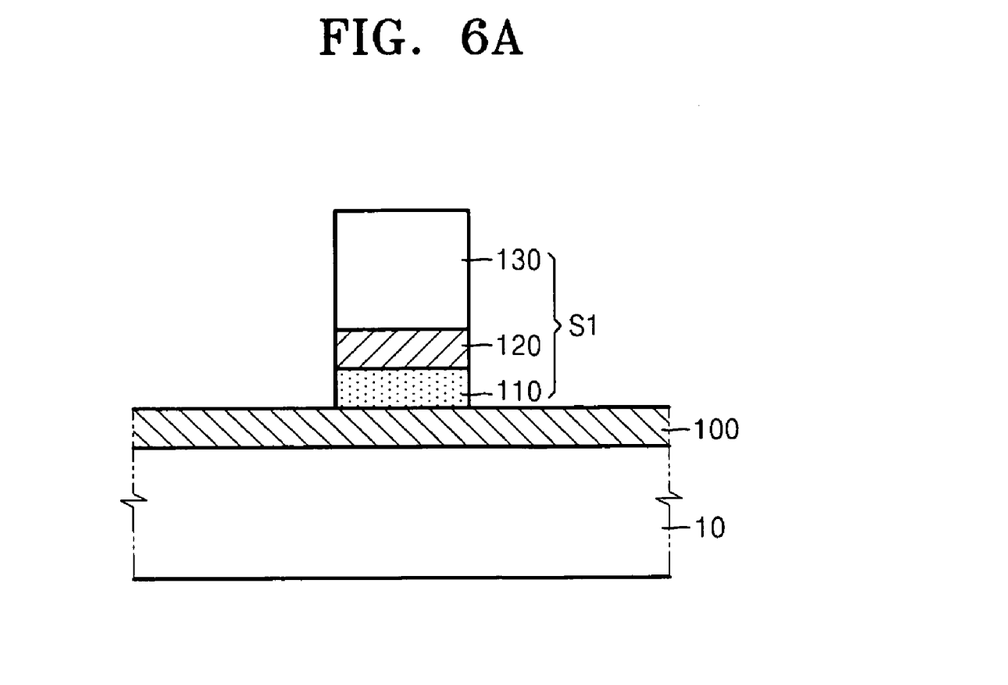
FIGS. 6A through 6E are cross-sectional views of a method of manufacturing a RRAM according to an example embodiment.

Referring to FIG. 6A, a first electrode 100 may be formed on a substrate 10. The first electrode 100 may be formed by patterning a metal layer in a given or desired shape, for example, a line shape. A stacked structure S1 having a pole shape may be formed on the first electrode 100. The stacked structure S1 may include a variable resistance layer 110, an intermediate electrode 120, and a diode 130 stacked sequentially on the first electrode 100. The variable resistance layer 110, the intermediate electrode 120, and the diode 130 may be patterned using the same etching mask layer. As a result, the variable resistance layer 110, the intermediate electrode 120, and the diode 130 may have the same or substantially the same planar shape. The positions of the variable resistance layer 110 and the diode 130 may be exchanged with each other and a contact electrode layer (not shown) patterned in the same or substantially the same shape as the diode 130 may be formed on the diode 130.

Figure 6B:
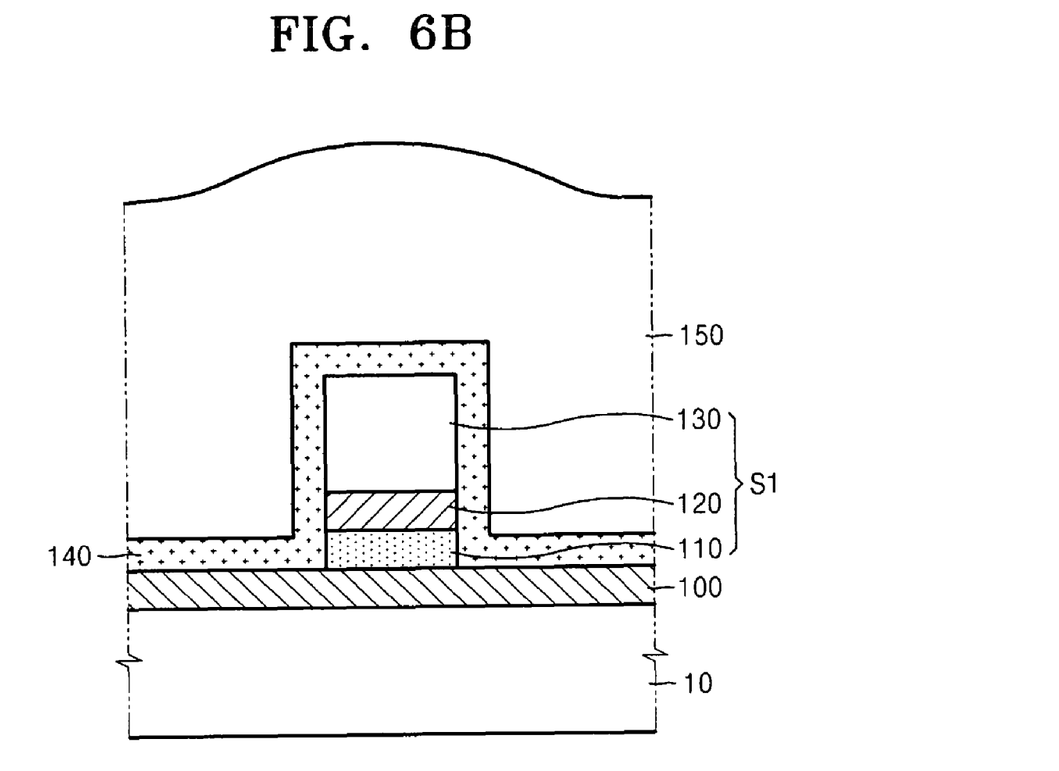

Referring to FIG. 6B, a protective layer 140 covering the first electrode 100 and the stacked structure S1 may be formed on the substrate 10. The protective layer 140 may be formed of an insulating metal compound layer, such as an aluminum oxide layer and/or a titanium oxide layer. In this example, the protective layer 140 may be formed by various methods such as an atomic layer deposition (ALD) method, a chemical layer deposition (CVD) method, a physical layer deposition (PVD) method, a spraying method, a solution growth method, a dip coating method, a spin coating method, or the like. The protective layer 140 may have a thickness in the range of several A to several thousands of A. An interlayer insulating layer 150 may be formed on the protective layer 140. The interlayer insulating layer 150 may be a silicon oxide layer and formed so as to have a vertical height greater than or equal to the stacked structure S1.

Figure 6C:
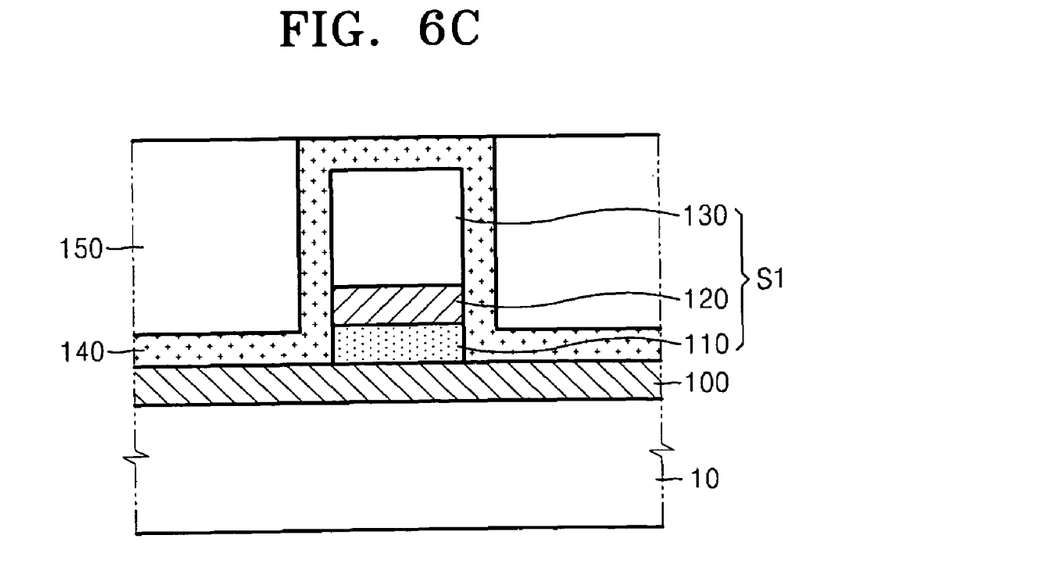

The protective layer 140 formed on an upper surface of the protective layer 140 may be exposed by performing a chemical mechanical polishing (CMP) (or similar) process on the interlayer insulating layer 150, as illustrated in FIG. 6C. In this example, the protective layer 140 may function as an etch stop layer.

Figure 6D:
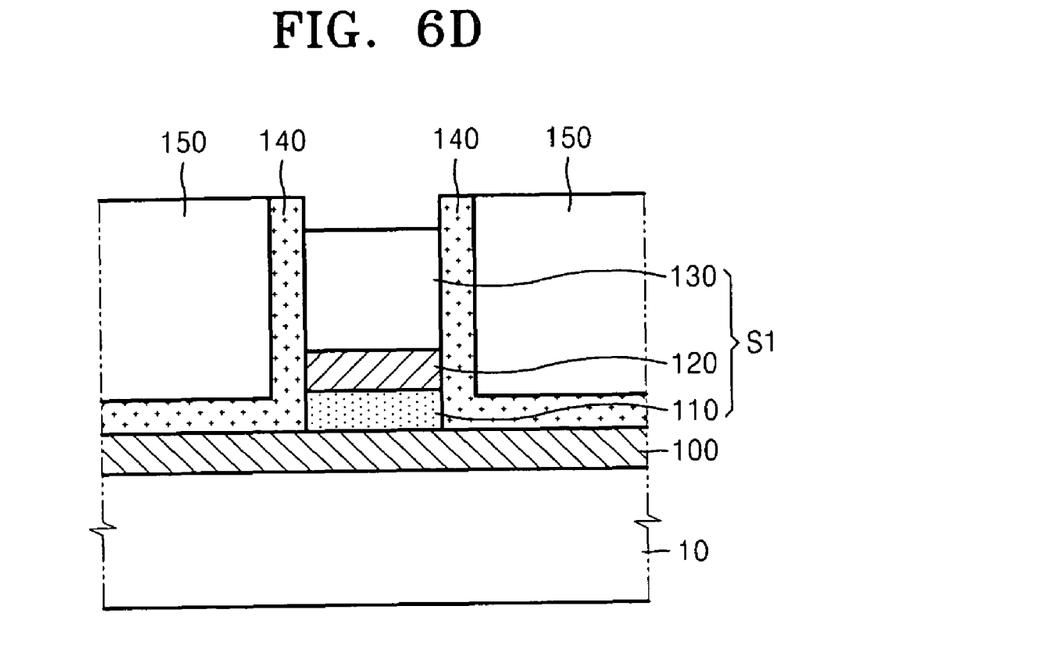

A top surface of the stacked structure S1 (e.g., a top surface of the diode 130) may be exposed by etching the exposed protective layer 140, as illustrated in FIG. 6D. If the positions of the diode 130 and the variable resistance layer 110 are exchanged with each other, a top surface of the variable resistance layer 110 may be exposed instead. Although not shown in the drawing, if an uppermost layer of the stacked structure S1 is a contact electrode layer, the contact electrode layer may be exposed.

Figure 6E:
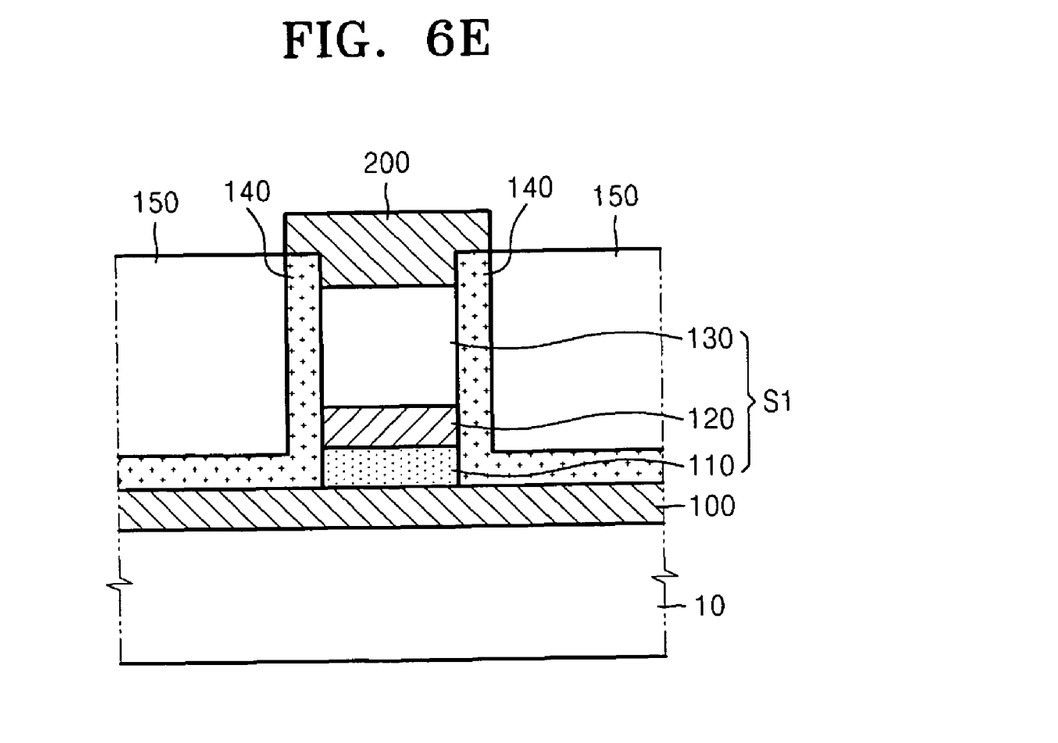

Referring to FIG. 6E, a second electrode 200 contacting the diode 130 may be formed on both the protective layer 140 and the interlayer insulating layer 150. The second electrode 200 may be formed by patterning a given metal layer in a given shape (e.g., a line shape). In this example, the second electrode 200 may be formed so as to cross the first electrode 100, for example, to cross the first electrode 100 at right angles. Although not shown in the drawing, the second stacked structure S2 and the third electrode 300 of FIG. 2 or the second stacked structure S2' and the third electrode 300 of FIG. 4 may further be formed on the second electrode 200.

FIGS. 7A through 7G are cross-sectional views of a method of manufacturing a RRAM according to another example embodiment. The example embodiment shown in FIGS. 7A through 7G may be used to manufacture the example embodiment of an RRAM shown in FIG. 5.

Figure 7A:
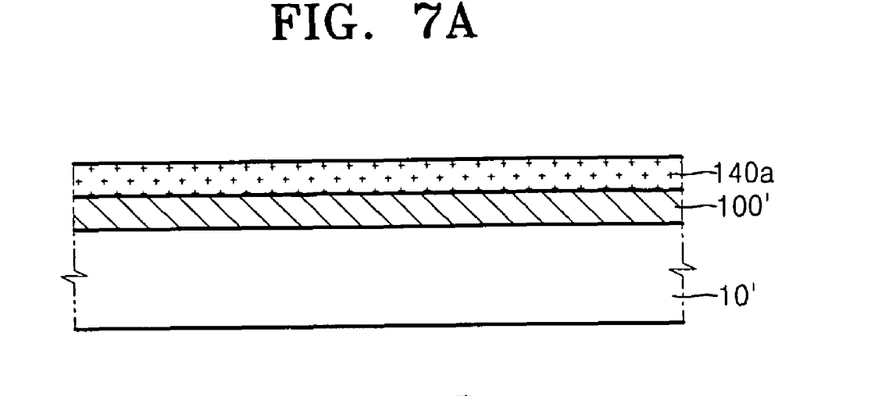
FIGS. 7A through 7G are cross-sectional views of a method of manufacturing a RRAM according to another example embodiment.

Referring to FIG. 7A, a first electrode 100' may be formed on the substrate 10'. The first electrode 100' may be formed by patterning a given metal layer in a desired (e.g., line) shape. A first intermediate insulating layer (not shown), having a height similar to, substantially similar to, the same or substantially the same as that of the first electrode 100' may be formed in both side portions of the first electrode 100' formed on the substrate 10'. The first intermediate insulating layer, however, may be omitted. A first lower protective layer 140a covering the first electrode 100' may be formed on the substrate 10' or the first intermediate insulating layer.

Figure 7B:
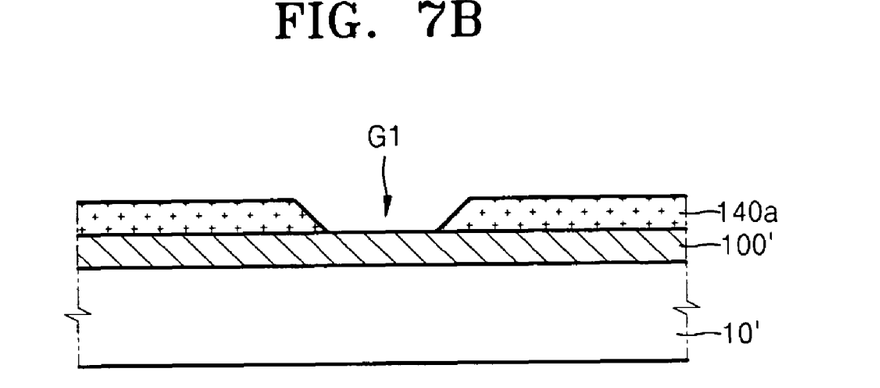

Referring to FIG. 7B, a first groove G1 exposing the first electrode 100' may be formed by removing a part or portion of the first lower protective layer 140a. In one example, the first groove G1 may be formed by inclination etching, and thus, a width thereof may decrease toward the first electrode 100' (e.g., the groove G1 may have sloped side surfaces). Alternatively, the first groove G1 may be formed so as to have a uniform or substantially uniform width according to the depth of the first groove G1.

Figure 7C:
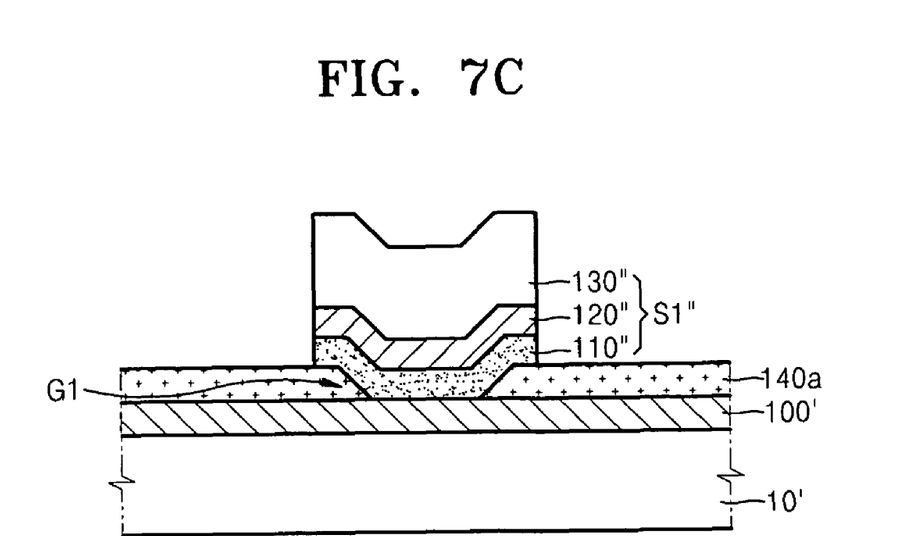

Referring to FIG. 7C, a first stacked structure S1" including a first variable resistance layer 110", a first intermediate electrode 120", and a first diode 130" may be formed on the first electrode 100' and the first lower protective layer 140a, which is formed around the first electrode 100'. The first variable resistance layer 100", the first intermediate electrode 120", and the first diode 130" may be layers patterned using the same etching mask layer. As a result, the first variable resistance layer 100", the first intermediate electrode 120", and the first diode 130" may have the same or substantially the same planar shape. Although not shown in the drawing, a contact electrode layer patterned in the same or substantially the same shape as the first diode 130" may be formed on the first diode 130".

Figure 7D:
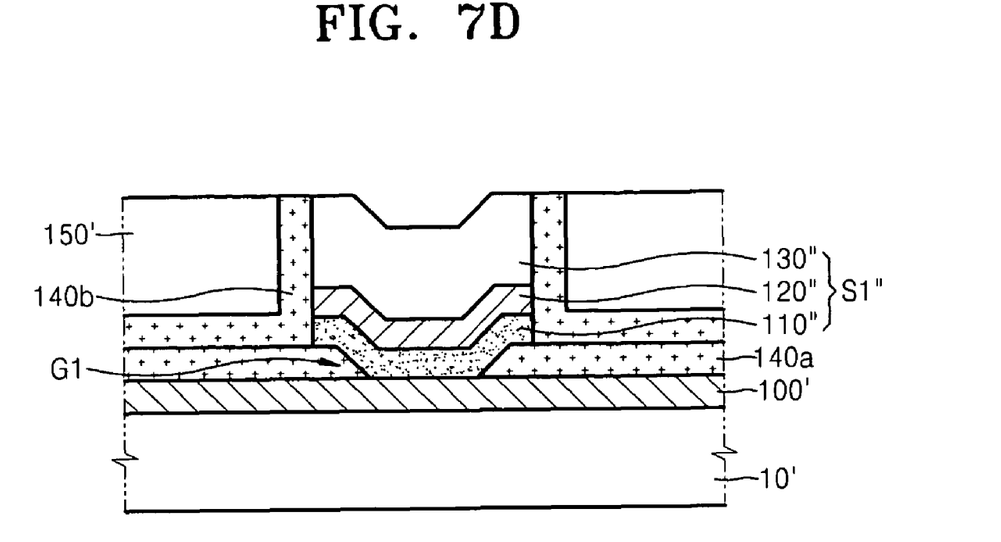

Referring to FIG. 7D, a first upper protective layer 140b and a first interlayer insulating layer 150' may be formed. Methods of forming the first upper protective layer 140b and the first interlayer insulating layer 150' may be similar or substantially similar to the methods of forming the protective layer 140 and the interlayer insulating layer 150 described with reference to FIGS. 6A through 6D, respectively. However, example embodiments are not limited thereto. The first upper protective layer 140b and the first interlayer insulating layer 150' may be formed so as to have vertical heights greater than or equal to the first stacked structure S1". In FIG. 7D, the first upper protective layer 140b may be formed on side surfaces of the first stacked structure S1" and on the first lower protective layer 140a. Alternatively, the first upper protective layer 140b may not be formed on the first lower protective layer 140a.

Figure 7E:
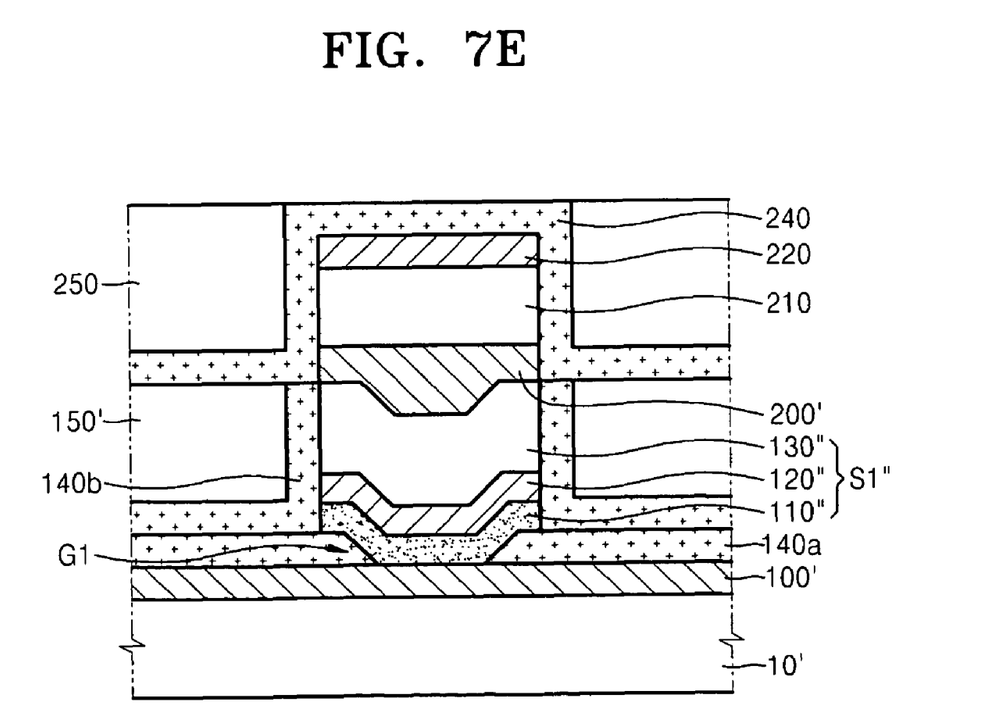

Referring to FIG. 7E, a second electrode 200' may be formed on the first diode 130". The second electrode 200' may be formed in a line pattern crossing the first electrode 100', for example, crossing the first electrode 100' at right angles. A second intermediate insulating layer (not shown), having a height similar to, substantially similar to, the same or substantially the same as that of the second electrode 200' may be formed on the first interlayer insulating layer 150', on both side portions of the second electrode 200', and on the first upper protective layer 140b. Alternatively, the second intermediate insulating layer may be omitted. A second diode 210 and a second intermediate electrode 220 may be formed sequentially on the second electrode 200'. The second diode 210 and the second intermediate electrode 220 may be patterned using the same etching mask layer. Therefore, the second diode 210 and the second intermediate electrode 220 may have the same or substantially the same planar shape. A second protective layer 240 covering the second electrode 200', the second diode 210, and the second intermediate electrode 220 may be formed on the first interlayer insulating layer 150' or the second intermediate insulating layer. An insulating layer may be formed on the second protective layer 240, and a CMP process may be performed on the insulating layer to expose the second protective layer 240 formed on the second intermediate electrode 220. The insulating layer remaining after the CMP process may serve as the second interlayer insulating layer 250.

Figure 7F:
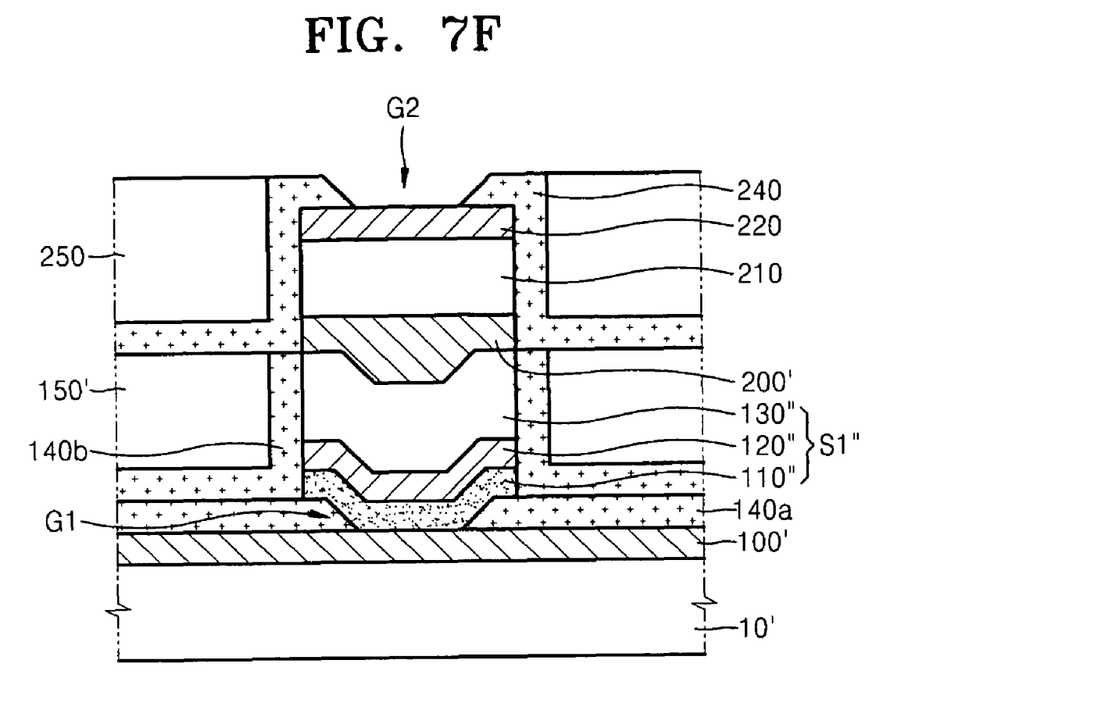

Referring to FIG. 7F, a second groove G2, exposing the second intermediate electrode 220, may be formed by removing a part of the second protective layer 240. The second groove G2 may have a shape similar or substantially similar to the first groove G1.

Figure 7G:
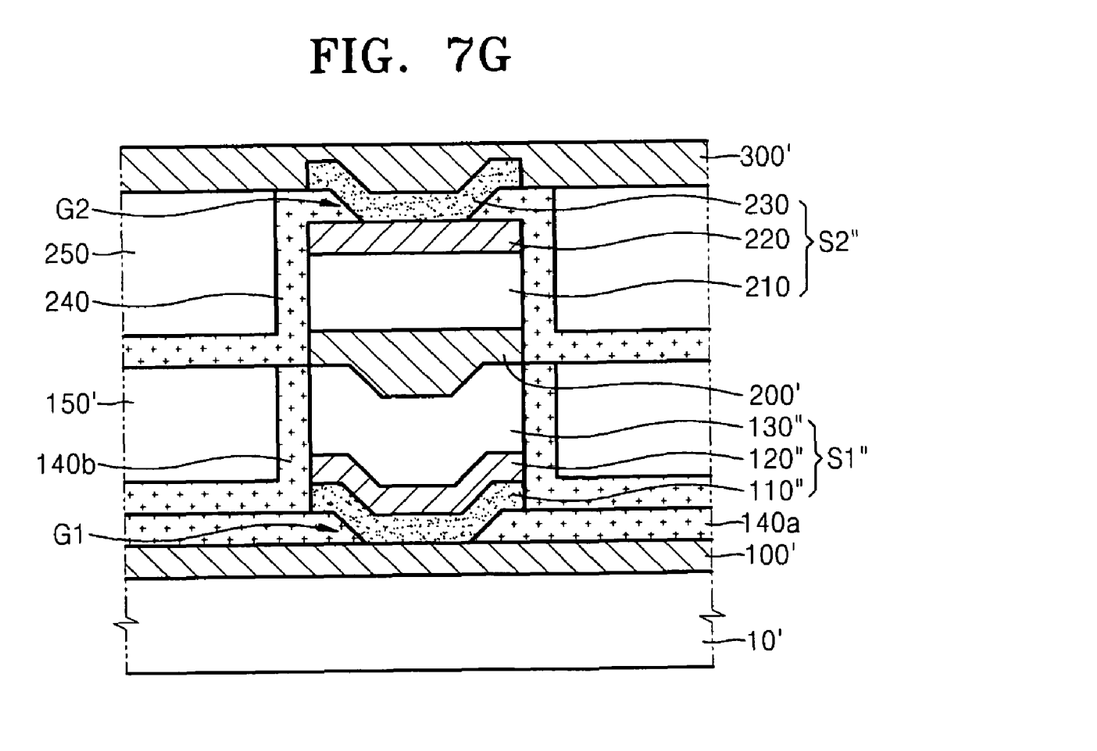

Referring to FIG. 7G, a second variable resistance layer 230 may be formed on the exposed second variable resistance layer 230 and part of the second protective layer 240 formed around the second intermediate electrode 220. The second variable resistance layer 230 may be formed to have the same or substantially the same planar shape as the second intermediate electrode 220. Alternatively, the second variable resistance layer 203 may have a different shape.

The second diode 210, the second intermediate electrode 220, and the second variable resistance layer 230 may constitute the second stacked structure S2". The second stacked structure S2" may have the same or substantially the same configuration as that of the second stacked structure S2" in FIG. 5.

A third electrode 300' contacting the second variable resistance layer 230 may also be formed. The third electrode 300' may have a line pattern extending to the second protective layer 240 formed in both side portions of the second variable resistance layer 230 and the second interlayer insulating layer 250. The third electrode 300' may cross the second electrode 200' at right angles.

The structure and components of the RRAM according to example embodiments may be modified in various forms. For example, instead of the diode 130 a transistor may be used as the switching device in the structure illustrated in FIG. 1 or a modified structure. In addition, by modifying and applying example embodiments of methods of manufacturing described with reference to FIGS. 6A through 6E, the structures of FIGS. 2 and 4 may be more easily manufactured.

While the present invention has been particularly shown and described with reference to example embodiments thereof, it will be understood by one skilled in the art that various changes in form and details may be made therein without departing from the spirit and scope of the present invention as defined by the appended claims.

What is claimed is:

1. A resistive random access memory comprising:
   a first electrode on a substrate;
   a stacked stricture including a variable resistance layer, an intermediate electrode and a switching device on the first electrode, the variable resistance layer, the intermediate electrode and the switching device being sequentially stacked on the first electrode, or the switching device, the intermediate electrode and the variable resistance layer being sequentially stacked on the first electrode;
   a protective layer surrounding the stacked structure and having an opening to expose an upper surface portion of the stacked structure, wherein the protective layer is formed of a material that does not cause a silicide reaction with the variable resistance layer;
   an interlayer insulating layer on the protective layer, an upper surface portion of the stacked structure not covered by the interlayer insulating layer; and
   a second electrode contacting the upper surface portion of the stacked structure.

2. The resistive random access memory of claim 1, wherein the protective layer is a material layer for preventing the permeation of hydrogen.

3. The resistive random access memory of claim 1, wherein the protective layer includes at least one of aluminum oxide and titanium oxide.

4. The resistive random access memory of claim 1, wherein the variable resistance layer is a metal oxide layer.

5. The resistive random access memory of claim 1, wherein the switching device is a diode.

6. The resistive random access memory of claim 5, wherein the protective layer covers at least a part of the diode.

7. The resistive random access memory of claim 1, wherein the protective layer covers side surfaces of the variable resistance layer, the intermediate electrode, and the switching device.

8. The resistive random access memory of claim 1, wherein the first electrode and the second electrode have wiring shapes and cross each other.

9. The resistive random access memory of claim 8, wherein the resistive random access memory is a multi-layer crosspoint memory device having a 1 diode-1 resistance (1D-1R) cell structure.

10. A method of manufacturing a resistive random access memory having a storage node including a variable resistance layer and a protective layer covering an exposed part of the variable resistance layer, the method comprising:
    forming a first electrode on a substrate;
    forming a stacked structure including the variable resistance layer, an intermediate electrode and a switching device on the first electrode, wherein the variable resistance layer, the intermediate electrode and the switching device are sequentially stacked on the first electrode, or the switching device, the intermediate electrode and the variable resistance layer are sequentially stacked on the first electrode, forming the protective layer to cover the first electrode and the stacked structure, forming an interlayer insulating layer on the protective layer, etching the interlayer insulating layer to expose the protective layer on an upper surface of the stacked structure, exposing the stacked structure by etching the exposed protective layer, and forming a second electrode contacting the stacked structure.

11. The method of claim 10, wherein the protective layer is formed of a material that does not cause a silicide reaction with the variable resistance layer.

12. The method of claim 10, wherein the protective layer is a material layer for preventing the permeation of hydrogen.

13. The method of claim 10, wherein the protective layer includes at least one of aluminum oxide and titanium oxide.

14. The method of claim 10, wherein the variable resistance layer is formed of metal oxide.

* * * * *